(12) United States Patent
Weber

(10) Patent No.: US 9,941,867 B1
(45) Date of Patent: Apr. 10, 2018

(54) CIRCUIT AND METHOD FOR UNIVERSAL PULSE LATCH

(71) Applicant: ALTERA CORPORATION, San Jose, CA (US)

(72) Inventor: Scott Weber, Piedmont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/270,437

(22) Filed: Sep. 20, 2016

(51) Int. Cl.
  *H03K 3/356* (2006.01)
  *H03K 19/177* (2006.01)
(52) U.S. Cl.
  CPC ... *H03K 3/356104* (2013.01); *H03K 19/1776* (2013.01); *H03K 19/17716* (2013.01)
(58) Field of Classification Search
  CPC ....... H03K 3/356121; H03K 3/356104; H03K 3/356078; H03K 3/356086; H03K 19/17716; H03K 19/1776
  See application file for complete search history.

(56) References Cited

U.S. PATENT DOCUMENTS

| | | | | |
|---|---|---|---|---|
| 5,629,643 A * | 5/1997 | Moughanni | ............ | H03K 3/012 327/199 |
| 6,643,793 B1 * | 11/2003 | Kouzuma | ............ | G06F 13/4217 713/600 |
| 6,693,460 B2 * | 2/2004 | Kanba | ............... | G01R 31/31727 326/16 |
| 7,190,196 B1 * | 3/2007 | Kaviani | ............ | H03K 3/356121 327/141 |
| 7,253,661 B1 * | 8/2007 | Tuan | ................. | H03K 3/356052 326/46 |
| 7,484,149 B2 * | 1/2009 | Lackey | ........... | G01R 31/318541 714/726 |
| 7,650,549 B2 * | 1/2010 | Branch | ........... | G01R 31/318552 714/724 |
| 7,843,218 B1 * | 11/2010 | Ramaraju | ....... | G01R 31/318541 326/38 |
| 7,872,512 B2 | 1/2011 | Lewis et al. | | |
| 7,873,896 B2 * | 1/2011 | Huang | .................... | G11C 29/32 714/718 |
| 8,067,971 B2 * | 11/2011 | Hoxey | .................... | G11C 7/106 327/199 |
| 8,963,581 B1 | 2/2015 | Lewis et al. | | |
| 8,970,274 B2 * | 3/2015 | Geisler | ............. | H03K 3/356113 327/239 |
| 9,360,884 B2 | 6/2016 | Galloway et al. | | |

(Continued)

*Primary Examiner* — Thomas J Hiltunen
(74) *Attorney, Agent, or Firm* — Compass IP Law PC

(57) ABSTRACT

One embodiment relates to a pulse latch that includes a latch control logic circuit and a pulse latch circuit. The latch control logic circuit generates a plurality of control signals and selects a control signal of the plurality of control signals to output to the pulse latch circuit. Each control signal of the plurality of control signals causes the pulse latch circuit to operate in a different operating mode. Another embodiment relates to a method of generating control signaling for a pulse latch. A clock signal and a shifted clock signal are received. A plurality of inputs to a multiplexor are generated using the clock signal and the shifted clock signal. An input of the plurality of inputs is selected as an output of the multiplexor. The input is selected by the multiplexor using a plurality of multiplexor configuration bits.

17 Claims, 6 Drawing Sheets

100

(56) References Cited

U.S. PATENT DOCUMENTS

2005/0110581 A1* 5/2005 Ngo .................. G04G 3/02
331/18
2011/0066906 A1* 3/2011 Tang ................ G01R 31/31858
714/731

* cited by examiner

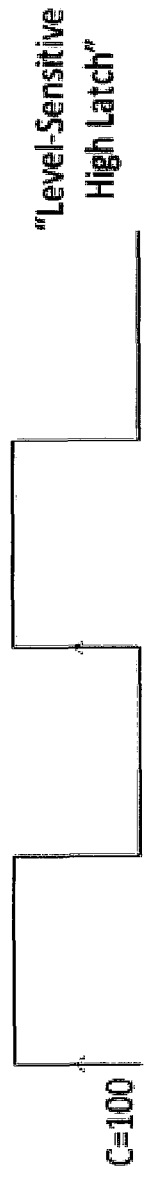
FIG. 4A  C=100  "Level-Sensitive High Latch"
FIG. 4B  C=101  "Level-Sensitive Low Latch"
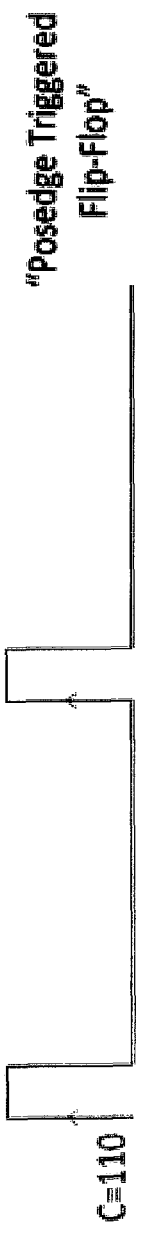
FIG. 4C  C=110  "Posedge Triggered Flip-Flop"
PW1
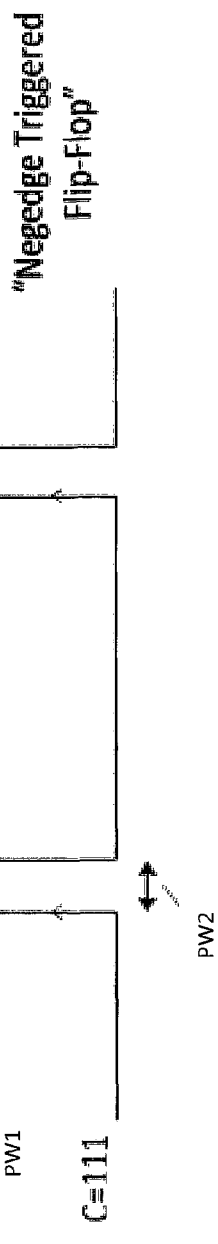
FIG. 4D  C=111  "Negedge Triggered Flip-Flop"
PW2
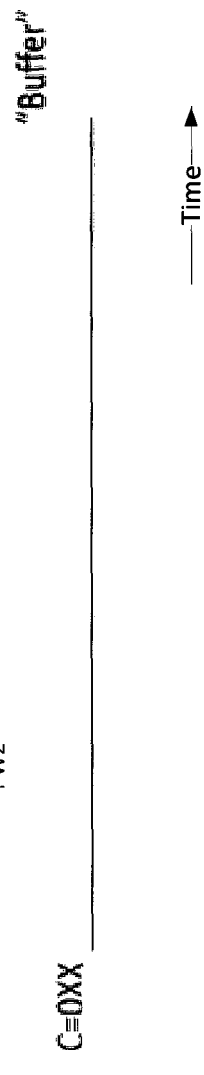
FIG. 4E  C=0XX  "Buffer"
— Time →

CIRCUIT AND METHOD FOR UNIVERSAL PULSE LATCH

BACKGROUND

Technical Field

The present disclosure relates generally to electronic circuits.

Description of the Background Art

A programmable logic device ("PLD") is a digital, user-configurable integrated circuit used to implement a custom logic function. PLDs have found particularly wide application as a result of their combined low up front cost and versatility to the user. For the purposes of this description, the term PLD encompasses any digital logic circuit configured by the end-user, and includes a programmable logic array ("PLA"), a field programmable gate array ("FPGA"), and an erasable and complex PLD.

The basic building block of a PLD is a logic element that is capable of performing logic functions on a number of input variables. The logic elements of a PLD may be arranged in groups of, for example, eight to form a larger logic array block ("LAB").

Multiple LABs (and other functional blocks, such as memory blocks, digital signal processing blocks, and so on) are generally arranged in a two-dimensional array in a PLD core. The blocks may be separated by horizontal and vertical interconnect channels so as to form a two-dimensional array. Inputs and outputs of the LABs may be programmably connectable to horizontal and vertical interconnect channels.

A variety of PLD architectural approaches to arranging the interconnect array and logic elements have been developed. These approaches generally aim to optimize logic density and/or signal routability between the various logic elements.

SUMMARY

One embodiment relates to a pulse latch that includes a latch control logic circuit and a pulse latch circuit. The latch control logic circuit generates a plurality of control signals and selects a control signal of the plurality of control signals to output to the pulse latch circuit. Each control signal of the plurality of control signals causes the pulse latch circuit to operate in a different operating mode.

Another embodiment relates to a method of generating control signaling for a pulse latch. A clock signal and a shifted clock signal are received by a latch control logic circuit. A plurality of inputs to a multiplexor are generated by the latch control logic circuit using the clock signal and the shifted clock signal. An input of the plurality of inputs is selected as an output of the multiplexor. The input is selected by the multiplexor using a plurality of multiplexor configuration bits.

Other embodiments, aspects, and features are also disclosed.

BRIEF DESCRIPTION OF THE DRAWINGS

FIGS. 4A-4E are timing diagrams depicting the control (latch_en) signal that is output of the electronically-configurable logic circuit when it is configured in five different clocking modes in accordance with an embodiment of the invention.

DETAILED DESCRIPTION

As the die size of PLDs continues to increase, it becomes challenging for existing routing architectures to support a high speed across an integrated circuit die in an efficient manner. For example, in order to support a high speed across the die, U.S. Pat. No. 8,693,581, entitled "Pipelined Direct Drive Routing Fabric," by David Lewis, et al., discloses circuitry and methods for pipelining at a fine grain, down to the level of individual logic elements (LEs) and routing wires, if desired.

The present disclosure provides a "universal" pulse latch that is electronically programmable (electronically configurable) to any one of multiple operating modes. Each operating mode corresponds to a different circuit functionality. In particular, the universal pulse latch may operate in any one of five distinct operating modes, each operating mode providing one of the following circuit functionalities: a level-sensitive high latch; a level-sensitive low latch; a positive-edge-triggered flip-flop, negative-edge-triggered flip-flop, and a buffer. The operating modes may be selected by programming configuration bits, without a need to change clock signals that are input to the universal pulse latch.

Advantageously, the universal pulse latch provides a flexible individual circuit that is electronically programmable to achieve a variety of circuit functionalities. This allows for more efficient usage of the pulse latches and simpler clock synthesis for controlling the pulse latches.

An exemplary implementation of the universal pulse latch includes an electronically-programmable latch control logic circuit and a pulse latch circuit. An exemplary embodiment of the latch control logic circuit is shown in FIG. 1, and an exemplary implementation of a pulse latch circuit controlled by the latch control logic circuit is shown in FIG. 2.

Figure 1:
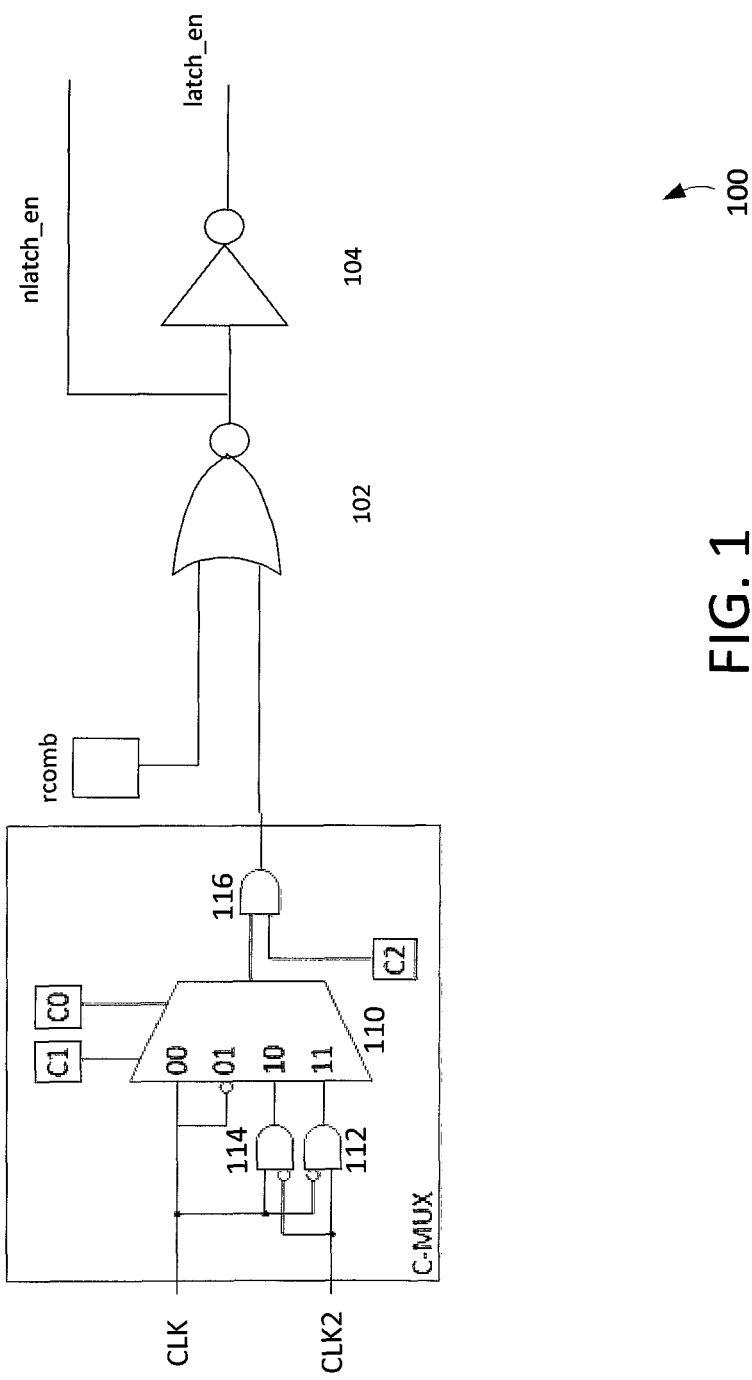
FIG. 1 depicts an exemplary implementation of a latch control logic circuit in accordance with an embodiment of the invention.
Figure 2:
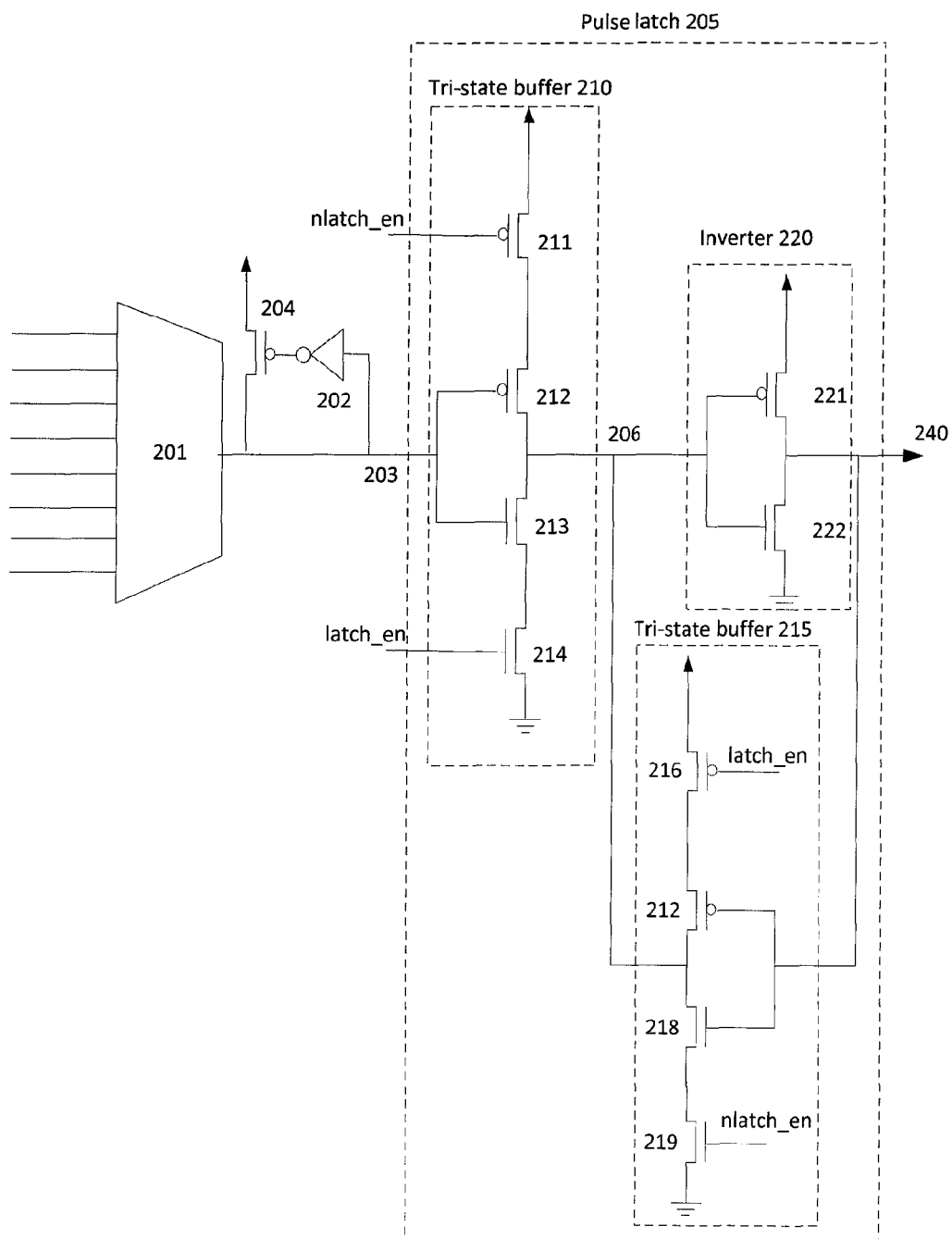
FIG. 2 shows an exemplary implementation of a pulse latch that may be utilized to pipeline a routing multiplexor in accordance with an embodiment of the invention.

FIG. 1 depicts an exemplary implementation of a latch control logic circuit 100 in accordance with an embodiment of the invention. The latch control logic circuit 100 generates control signals for the pulse latch circuit.

In an exemplary implementation, the latch control circuit 100 may receive two clock inputs CLK and CLK2 and may generate control signals latch_en (latch enable) and nlatch_en (the inverse of latch enable). As shown in FIG. 1, the latch control logic circuit 100 may be implemented using a "combined" multiplexor (C-MUX), a NOR logic gate 102, and an inverter 104.

As further shown, the C-MUX circuit may be implemented using an electronically-programmable multiplexor 110, three AND logic gates 112, 114, and 116, and three electronically-programmable configuration bits C0, C1 and C2. The first AND gate 112 has as its inputs the clock input CLK and the inverse of the clock input CLK2. The second AND gate 114 has as its inputs the inverse of the clock input CLK, and the clock input CLK2. The third AND gate 116 has as its inputs the output of the multiplexor 110 and the C2 configuration bit, which may be referred to as a bypass configuration bit.

The output of the C-MUX circuit is controlled by the three electronically-programmable configuration bits C2, C1 and C0 that form the configuration vector C={C2, C1, C0}. The value of the configuration bit C2 determines whether or not the C-MUX circuit operates in a bypass mode so as to function as a "buffer". When C2=0, the C-MUX circuit is in the bypass mode and outputs a logical 0 signal. When C2=1, the C-MUX circuit may be configured to operate in one of four modes, depending on the values of the two configuration bits C1 and C0, which may be referred to as multiplexor configuration bits.

As shown in the figure, the two configuration bits C1 and C0 control the selection made by the multiplexor 110. The 00 input of the multiplexor 110 receives the clock input CLK. When C1=0 and C0=0, the 00 input is selected to be output. The 01 input of the multiplexor 110 receives the inverse of the clock input CLK. When C1=0 and C0=1, the 01 input is selected to be output. The 10 input of the multiplexor 110 receives the output of the first AND gate 112. When C1=1 and C0=0, the 10 input is selected to be output. Finally, the 11 input receives the output of the second AND gate 114. When C1=1 and C0=1, the 11 input is selected to be output.

As further shown in the figure, the NOR gate 102 and an inverter 104 may be arranged in series. The NOR gate 102 may receive control signal rcomb at a first input and the output of the C-MUX circuit at a second input. In an exemplary implementation, the rcomb signal may be reset to a low state to enable the pipeline mode for the controlled pulse latch 205. (Alternatively, a non-pipeline mode may be configured by setting the rcomb signal to a high state. In this non-pipeline mode, the input to the pulse latch 205 is always enabled such that the signal bit is not registered.)

The output of the NOR gate 102 is connected to the input of the inverter 104. The inverter 104 outputs the latch enable signal latch_en, while the inverse latch enable signal nlatch_en may be obtained from the output of the NOR gate 102.

FIG. 2 shows an exemplary implementation of a pulse latch circuit 205 that may be utilized to pipeline a routing multiplexor 201 in accordance with an embodiment of the invention. The routing multiplexor 201 may be, for example, a DIM (direct input multiplexor) or a LIM (LAB line input multiplexor) that is being pipelined using the pulse latch circuit 205. The output line 240 of the pulse latch circuit 205 may be a routing wire that is being driven by the pipelined routing multiplexor 200.

As shown in the figure, the input line 203 to the pulse latch 205 may be connected to the output of a routing multiplexor 201. In addition, the output of routing multiplexor 201 may be connected to the input of inverter 202 and the drain of PMOS transistor 204, the source of PMOS transistor 204 may be connected to a supply voltage, and the gate of the PMOS transistor 204 may be connected to the output of inverter 202.

As depicted in FIG. 2, the pulse latch circuit 205 may be formed using two tri-state buffers (210 and 215) and an inverter 220. The input of the inverter 220 may be connected at storage node 206 to the outputs of both the first tri-state buffer 210 and the second tri-state buffer 215. As further shown, the output of the inverter 220 may be connected to the input of the second tri-state buffer 215 and also to the output line 240.

The first tri-state buffer 210 may be implemented as a CMOS circuit with four transistors in series: PMOS transistor 211; PMOS transistor 212; NMOS transistor 213; and NMOS transistor 214. In the implementation shown, the source of PMOS transistor 211 is connected to a supply voltage, while the source of NMOS transistor 214 is connected to ground. The drain of PMOS transistor 211 is connected to the source of PMOS transistor 212, and the drain of NMOS transistor 214 is connected to the source of NMOS transistor 213. The gates and drains PMOS transistor 212 and NMOS transistor 213 are connected to each other to form the input node and the output node, respectively. The input node is connected to the input line 203 for the pulse latch circuit 205, and the output node is connected to the storage node 206. The gate of NMOS transistor 214 receives pulsed control signal latch_en, while the gate of PMOS transistor 211 receives the inverse pulsed control signal nlatch_en (where nlatch_en is the inverse of latch_en).

The second tri-state buffer 215 also may be implemented as a CMOS circuit with four transistors in series: PMOS transistor 216; PMOS transistor 217; NMOS transistor 218; and NMOS transistor 219. In the implementation shown, the source of PMOS transistor 216 is connected to a supply voltage, while the source of NMOS transistor 219 is connected to ground. The drain of PMOS transistor 216 is connected to the source of PMOS transistor 217, and the drain of NMOS transistor 219 is connected to the source of NMOS transistor 218. The gates and drains PMOS transistor 212 and NMOS transistor 213 are connected to each other to form the input node and the output node, respectively. The input node is connected to the output of the inverter 220, and the output node is connected to the storage node 206. The gate of PMOS transistor 219 receives pulsed control signal latch_en, while the gate of NMOS transistor 216 receives the inverse pulsed control signal nlatch_en.

The inverter 220 may be implemented as a CMOS inverter which includes PMOS transistor 221 and NMOS transistor 222 in series. In the implementation shown, the source of PMOS transistor 221 is connected to a supply voltage, while the source of NMOS transistor 222 is connected to ground. The gates and drains of PMOS transistor 221 and NMOS transistor 222 are connected together to form the input node and output node, respectively. The input node is connected to the storage node 206. The output node is connected to both the input of the second tri-state buffer 215 and to the output line 240.

Figure 3:
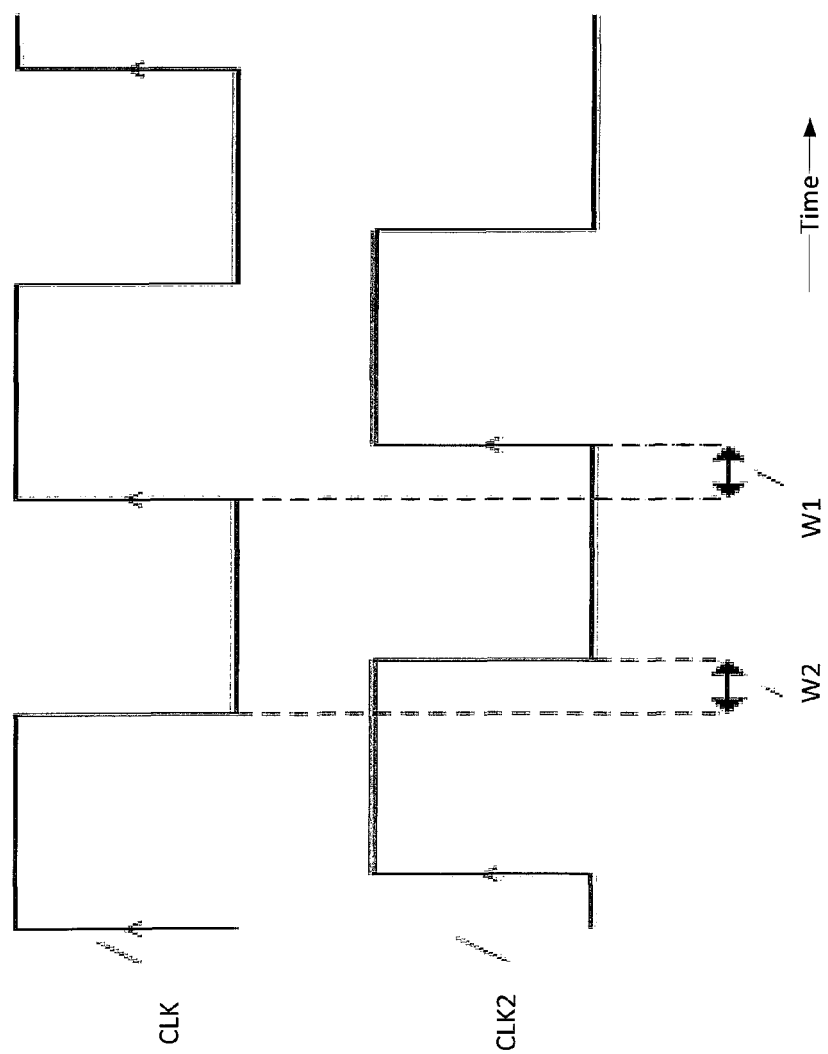
FIG. 3 depicts two input clock signals for the latch control logic circuit in accordance with an embodiment of the invention.

FIG. 3 depicts two input clock signals, CLK and CLK2, for the latch control logic circuit 100 in accordance with an embodiment of the invention. As shown, the CLK2 clock signal is a shifted version of the CLK clock signal. The phase shifts between the positive and negative edges of CLK and CLK2 may be of widths W1 and W2, respectively. In one implementation, the CLK and CLK2 clock signals may have a 50/50 duty cycle. In other implementations, the CLK and CLK2 clock signals may have non-50/50 duty cycles, such as, for example, a 55/45 duty cycle.

FIG. 4A is a timing diagram depicting the control (latch_en) signal that is output of the electronically-configurable logic circuit 100 when it is configured in the mode C={C2, C1, C0}={1, 0, 0} in accordance with an embodiment of the invention. This form of the latch_en signal causes the pulse latch circuit to operate as a level-sensitive high latch.

FIG. 4B is a timing diagram depicting the control (latch_en) signal that is output of the electronically-configurable logic circuit 100 when it is configured in the mode C={C2, C1, C0}={1, 0, 1} in accordance with an embodiment of the invention. This form of the latch_en signal causes the pulse latch circuit to operate as a level-sensitive low latch.

FIG. 4C is a timing diagram depicting the control (latch_en) signal that is output of the electronically-configurable logic circuit 100 when it is configured in the mode C={C2, C1, C0}={1, 1, 0} in accordance with an embodiment of the invention. This form of the latch_en signal is a pulsed clock signal that includes a series of pulses. Each pulse in the series has a pulse of width PW1 at each rising (positive) edge of the CLK signal and causes the pulse latch circuit to operate as a positive-edge-triggered flip-flop.

In order for the pulse latch to work correctly as a positive-edge-triggered flip-flop, the pulse width PW1 must be sufficiently wide to meet the requirements that depend on the pulse latch circuitry. The pulse width PW1 is a function of the phase difference between the positive edges of CLK and CLK2 (i.e. W1) and of the skew and slew of the C-MUX circuit.

FIG. 4D is a timing diagram depicting the control (latch_en) signal that is output of the electronically-configurable logic circuit 100 when it is configured in the mode C={C2, C1, C0}={1, 1, 1} in accordance with an embodiment of the invention. This form of the latch_en signal is a pulsed clock signal that includes a series of pulses. Each pulse in the series has a pulse of width PW2 at each falling (negative) edge of the CLK signal and causes the pulse latch to operate as a negative-edge-triggered flip-flop. Note that the series of pulses in FIG. 4D are shifted from the series of pulses in FIG. 4C by half of a clock cycle of the CLK signal.

In order for the pulse latch to work correctly as a negative-edge-triggered flip-flop, the pulse width PW2 must be sufficiently wide to meet the requirements that depend on the pulse latch circuitry. The pulse width PW2 is a function of the phase difference between the negative edges of CLK and CLK2 (i.e. W2) and of the skew and slew of the C-MUX circuit.

FIG. 4E is a timing diagram depicting the control (latch_en) signal that is output of the electronically-configurable logic circuit 100 when it is configured in the mode C={C2, C1, C0}={0, X, X} (where X=do not care) in accordance with an embodiment of the invention. This form of the latch_en signal is a constant low-level signal causes the pulse latch circuit to operate as a buffer.

Figure 5:
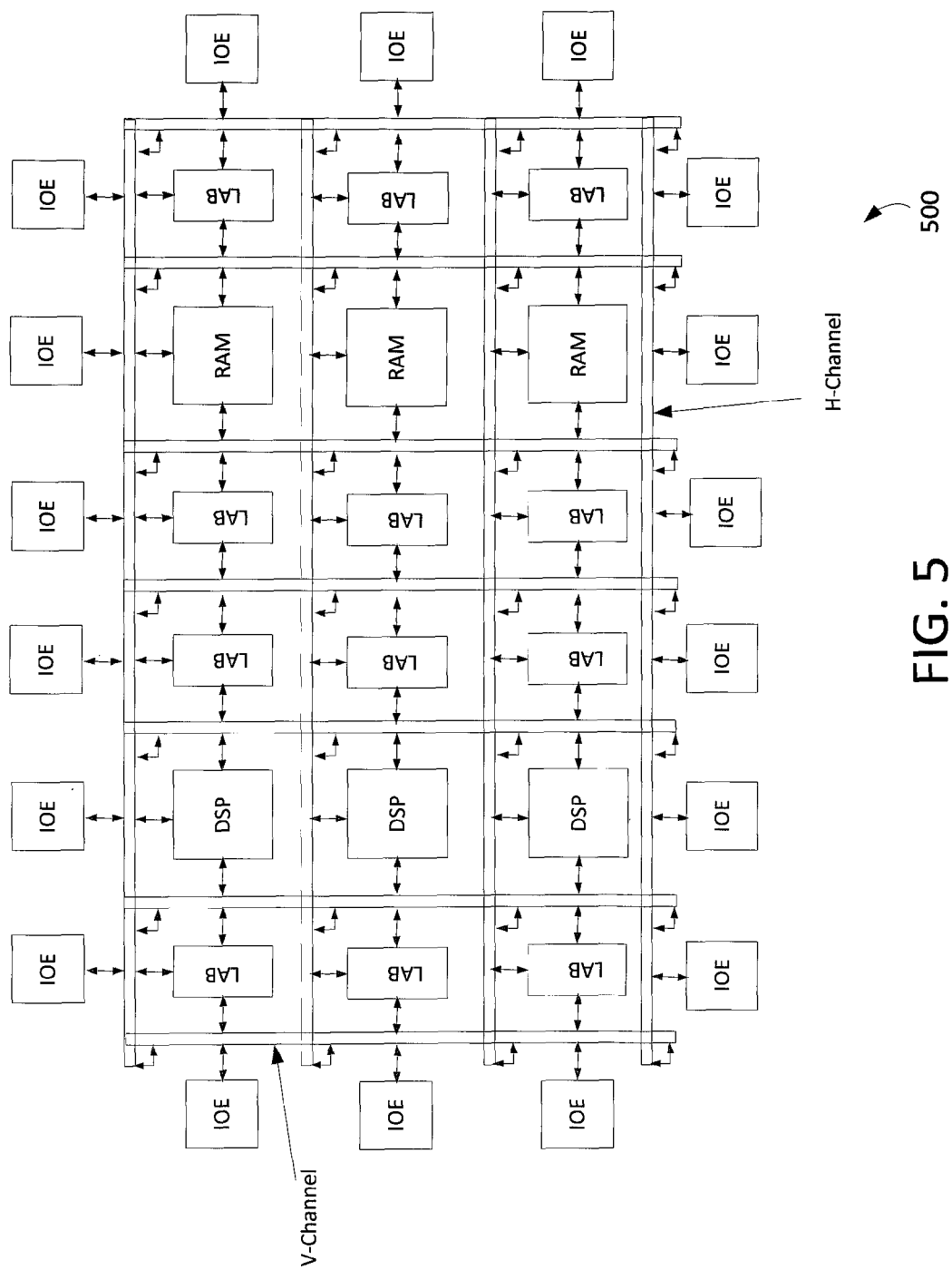
FIG. 5 is an overview of an exemplary routing topology for an FPGA.

FIG. 5 is an overview of an exemplary routing topology 500 for an FPGA. An embodiment of the present invention may be implemented within such a routing topology. Note that other routing wire topologies, besides the topology 500 depicted, are intended to be included within the scope of the present invention. For example, the routing wire topology may include wires that do not exist completely within a single routing channel, such as wires that travel diagonally or that travel horizontally and vertically along different parts of their extent. Furthermore, it should be understood that embodiments of the present invention are not limited to being implemented in an FPGA and may be implemented in other integrated circuits with a programmable fabric.

As shown, the FPGA includes a two-dimensional array of functional blocks, including logic array blocks (LABs) and other functional blocks, such as random access memory (RAM) blocks and digital signal processing (DSP) blocks, for example. The FPGA also includes programmable interconnect in the form of horizontal and vertical channels, each channel including one or more routing wires. In addition, input/output elements (IOEs) may be located around the periphery of the chip.

Routing wires are typically shorter than the entire length of the channel. A length n wire spans n functional blocks. For example, a length 4 wire spans 4 blocks. Length 4 wires are referred to as H4 wires in a horizontal channel and V4 wires in a vertical channel.

In a direct drive routing architecture, each wire is driven at a single logical point by a driver. In most cases, the driver is associated with a multiplexer which selects a signal to drive on the wire. In the case of channels with a fixed number of wires along their length, a driver may be placed at each starting point of a wire.

Different routing architectures may have LABs which connect to different numbers of routing channels. A three-sided routing architecture is depicted in the figure due to there being bi-directional connections on three sides of each functional unit to the routing channels. Other routing architectures are also intended to be included within the scope of the present invention. Examples of other routing architectures include 1-sided, 1½-sided, 2-sided, and 4-sided routing architectures.

Figure 6:
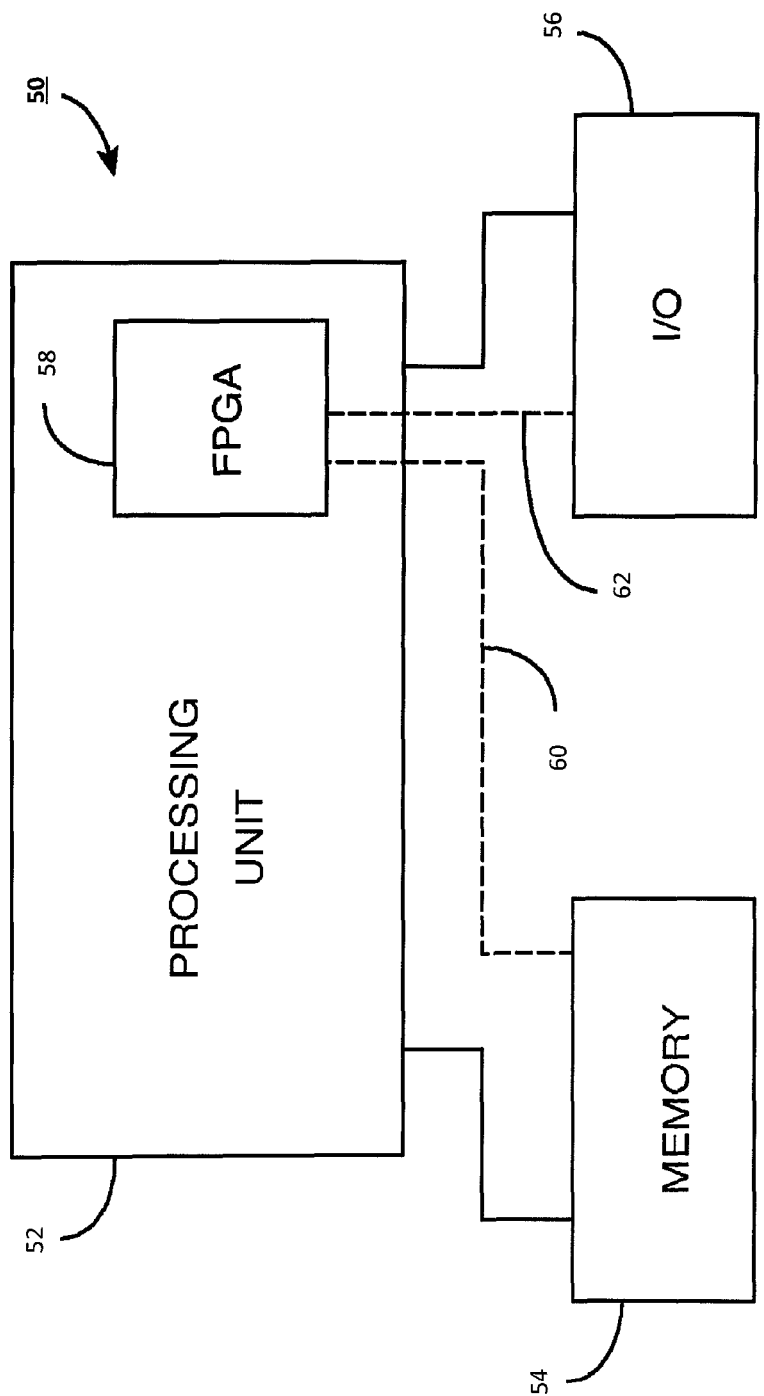
FIG. 6 shows a block diagram of an exemplary digital system that may employ circuitry and methods disclosed herein.

FIG. 6 is a block diagram of an exemplary digital system 50 that may employ circuitry and methods disclosed herein. System 50 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 50 may be provided on a single board, on multiple boards, or within multiple enclosures.

System 50 includes a processing unit 52, a memory unit 54, and an input/output (I/O) unit 56 interconnected together by one or more buses. According to this exemplary embodiment, FPGA 58 is embedded in processing unit 52. FPGA 58 can serve many different purposes within the system 50. FPGA 58 can, for example, be a logical building block of processing unit 52, supporting its internal and external operations. FPGA 58 is programmed to implement the logical functions necessary to carry on its particular role in system operation. FPGA 58 can be specially coupled to memory 54 through connection 60 and to I/O unit 56 through connection 62.

Processing unit 52 may direct data to an appropriate system component for processing or storage, execute a program stored in memory 54, receive and transmit data via I/O unit 56, or other similar function. Processing unit 52 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 58 may control the logical operations of the system. As another example, FPGA 58 acts as a reconfigurable processor that may be reprogrammed as needed to handle a particular computing task. Alternately, FPGA 58 may itself include an embedded microprocessor. Memory unit 54 may be a random access memory (RAM), read only memory (ROM), fixed or flexible disk media, flash memory, tape, or any other storage means, or any combination of these storage means.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. A pulse latch comprising:
a latch control logic circuit that generates a plurality of control signals and selects a control signal of the plurality of control signals, wherein the latch control logic circuit receives first and second clock input signals, and wherein the second clock input signal is a phase-shifted version of the first clock input signal; and
a pulse latch circuit that receives the control signal output from the latch control logic circuit,
wherein each control signal of the plurality of control signals causes the pulse latch circuit to operate in a different operating mode,
wherein the latch control logic circuit comprises a multiplexor that selects one of a plurality of inputs and further comprises an AND gate that receives the first clock signal and an inverse of the second clock signal and outputs an input of the multiplexor, and
wherein the input is selected by the multiplexor for the pulse latch circuit to operate as a positive-edge triggered flip-flop circuit.

2. The pulse latch of claim 1, wherein a first control signal of the plurality of control signals is selected for the pulse latch circuit to operate as a level-sensitive high latch.

3. The pulse latch of claim 2, wherein a second control signal of the plurality of control signals is selected for the pulse latch circuit to operate as a level-sensitive low latch.

4. The pulse latch of claim 3, wherein the second control signal is an inverse of the first control signal.

5. The pulse latch of claim 1, wherein a first control signal of the plurality of control signals causes the pulse latch circuit to operate as a positive-edge triggered flip-flop circuit.

6. The pulse latch of claim 5, wherein a second control signal of the plurality of control signals causes the pulse latch circuit to operate as a negative-edge triggered flip-flop circuit.

7. The pulse latch of claim 6, wherein the first control signal provides pulses beginning at each positive edge of the first clock signal, and wherein the second control signal provides pulses beginning at each negative edge of the first clock signal.

8. The pulse latch of claim 1, wherein an input of the multiplexor receives the first clock signal and is selected by the multiplexor for the pulse latch circuit to operate as a level-sensitive high latch.

9. The pulse latch of claim 1, wherein an input of the multiplexor receives an inverse of the first clock signal and is selected by the multiplexor for the pulse latch circuit to operate as a level-sensitive low latch.

10. The pulse latch of claim 1, wherein the latch control logic circuit further comprises:
an AND gate that receives an inverse of the first clock signal and the second clock signal and outputs an input of the multiplexor,
wherein the input is selected by the multiplexor for the pulse latch circuit to operate as a negative-edge triggered flip-flop circuit.

11. The pulse latch of claim 1, wherein the latch control logic further comprises:
an AND gate that receives an output of the multiplexor and a configuration bit,
wherein resetting the configuration bit to logical zero causes the pulse latch circuit to operate as a buffer.

12. A method of generating control signaling for a pulse latch, the method comprising:
receiving a clock signal and a shifted clock signal by a latch control logic circuit;
generating a plurality of inputs to a multiplexor, wherein the plurality of inputs are generated by the latch control logic circuit using the clock signal and the shifted clock signal;
selecting an input of the plurality of inputs as an output of the multiplexor, wherein the input is selected by the multiplexor using a plurality of multiplexor configuration bits; and
receiving the output of the multiplexor as a first input to an AND gate and a bypass configuration bit as a second input to the AND gate.

13. The method of claim 12, wherein the plurality of inputs includes the clock signal and the shifted clock signal.

14. The method of claim 12, wherein the plurality of inputs includes a first pulsed clock signal that includes a first series of pulses and a second pulsed clock signal that includes a second series of pulses, wherein the second series of pulses are shifted from the first series of pulses by half a clock cycle of the clock signal.

15. A control logic circuit that provides control signals to a pulse latch circuit, the control logic circuit comprising:
a multiplexor that selects one of a plurality of input signals, wherein a first input signal of the plurality of input signals comprises a first clock signal, and wherein a second input signal of the plurality of input signals comprises a second clock signal that is a shifted version of the first clock signal;
a first AND gate that receives the first clock signal and an inverse of the second clock signal and outputs a third input signal of the plurality of signals to the multiplexor; and
a second AND gate that receives an inverse of the first clock signal and the second clock signal and outputs a fourth input signal of the plurality of signals to the multiplexor.

16. The control logic circuit of claim 15, wherein the multiplexor selects the first input signal for the pulse latch circuit to operate as a level-sensitive high latch, the multiplexor selects the second input signal for the pulse latch circuit to operate as a level-sensitive low latch, the multiplexor selects the third input signal for the pulse latch circuit to operate as a positive-edge triggered flip-flop circuit, and the multiplexor selects the fourth input signal for the pulse latch circuit to operate as a negative-edge triggered flip-flop circuit.

17. The control logic circuit of claim 15, further comprising:
a third AND gate that receives an output of the multiplexor and a bypass configuration bit, wherein resetting the configuration bit to logical zero causes the pulse latch circuit to operate as a buffer.

* * * * *